United States Patent [19]
Park

[11] Patent Number: 5,786,229
[45] Date of Patent: Jul. 28, 1998

[54] METHOD FOR PROVIDING ISOLATION BETWEEN SEMICONDUCTOR DEVICES USING EPITAXIAL GROWTH AND POLISHING

[75] Inventor: Sang-Hoon Park, Kyoungki-do, Rep. of Korea

[73] Assignee: Hyundai Electronics Industries Co., Ltd., Rep. of Korea

[21] Appl. No.: 579,880

[22] Filed: Dec. 28, 1995

[30] Foreign Application Priority Data

Dec. 30, 1994 [KR] Rep. of Korea ............... 1994 39093
Dec. 30, 1994 [KR] Rep. of Korea ............... 1994 39095

[51] Int. Cl.⁶ .................................................. H01L 21/761
[52] U.S. Cl. ................ 437/67; 437/90; 148/DIG. 50
[58] Field of Search ......................... 437/67, 69, 70, 437/89, 90, 228 PL; 148/DIG. 50

[56] References Cited

U.S. PATENT DOCUMENTS

| | | | |
|---|---|---|---|
| 4,758,531 | 7/1988 | Beyer et al. | 437/67 |
| 4,948,456 | 8/1990 | Schubert | 437/90 |
| 5,087,586 | 2/1992 | Chan et al. | 437/90 |
| 5,108,946 | 4/1992 | Zdebel et al. | 437/90 |
| 5,135,884 | 8/1992 | Miller | 437/90 |

*Primary Examiner*—Chandra Chaudhuri
*Attorney, Agent, or Firm*—Ware, Fressola, Van Der Sluys, & Adolphson

[57] ABSTRACT

A method for isolation between semiconductor devices includes the steps of: forming sequentially a first oxide film and silicon nitride layer on a silicon substrate; forming a first photoresist pattern on the nitride layer where field oxide is not to be formed; etching the exposed nitride to predetermined depth; stripping the first photoresist film; oxidizing the resultant wafer of the above step until a second oxide grows on the etched silicon substrate and extends itself from the region of the patterned nitride and first oxide layer to a predetermined outward distance; forming a second photoresist film at the portions excepting the surface of the nitride layer; etching the nitride layer, the first oxide layer and a portion of second oxide positioned at the vertical downward direction under the first oxide; stripping the second photoresist film, growing epitaxially the exposed portion of the etched silicon substrate; depositing an insulating layer on the resultant structure of the above step and polishing the deposited insulating layer until the epitaxial layer is exposed.

9 Claims, 4 Drawing Sheets

METHOD FOR PROVIDING ISOLATION BETWEEN SEMICONDUCTOR DEVICES USING EPITAXIAL GROWTH AND POLISHING

TECHNICAL FIELD

The present invention relates generally to a method for isolation between semiconductor devices. More specifically, the invention is directed to a method for the isolation between semiconductor devices which enables the maximization of active regions in semiconductor devices.

BACKGROUND OF THE INVENTION

In fabricating a semiconductor device, for example, in a memory cell such as DRAM, SRAM etc., isolation between the devices is typically achieved by a selective oxidation.

FIG. 1 is partial cross-sectional view of field oxidation layer including the surrounding active regions, which is formed by a conventional selective oxidation method of local oxidation of silicon (hereinafter referred to as "LOCOS" process). The process is as follows.

Referring to FIG. 1, a thermal oxidation layer 2 is formed on a semiconductor substrate 1 of silicon by thermal oxidation. Afterwards, silicon nitride layer 3 is formed on the formed oxide layer 2. Thereafter, photoresist film (not shown) is deposited on the silicon nitride layer 3 and is patterned by exposure to light and etched so as to expose predetermined portions to be field oxidation layers for isolation between the devices. The exposed portions are etched away by a solution that selectively etches only the nitride material, in which the patterned photoresist film acts as an etch barrier against said solution. Thereafter, the patterned photoresist layer is stripped by a stripping solution.

The wafer which has the oxide layer and the patterned nitride layer thereon, is set in a thermal furnace for predetermined time. Next, an implant is performed in the field regions to create a channel-stop doping layer under the field oxide.

Thereafter, the oxide in the exposed portions is thermally grown by means of wet oxidation, at temperature of approximately 1000° C. for 2-4 hours. The oxide grows where there is no masking nitride. As the result of the above processes, the field oxide 4 as shown in FIG. 1 is formed.

But, when the field oxidation layer is formed by the above conventional LOCOS isolation method, some oxidant also diffuses laterally at the edges of the nitride. This causes the oxide to grow under and lift the nitride edges. Because the shape of the oxide at the nitride edges is that of a slowly tapering oxide wedge that merges into the pad oxide, it has been named a "bird's beak". The "bird's beak" is a lateral extension of the field oxide into the active area of the devices, and therefore creates the problem of decreasing the active regions.

DISCLOSURE OF INVENTION

In view of the foregoing, it is an object of the invention to provide a method of isolation between the semiconductor devices, capable of maximizing the active regions in a memory cell without the generation of a bird's beak.

To achieve this object, the present invention of isolation between the semiconductor devices is characterized by a method comprising the steps of:

(A) forming sequentially a first oxide film and silicon nitride layer on a semiconductor substrate of silicon;

(B) forming a first photoresist pattern on the nitride layer where the field oxide for isolation between semiconductor devices is not to be formed;

(C) etching the exposed nitride without the photoresist film and thereunder silicon layer to a predetermined depth;

(D) stripping the first photoresist film to form a resultant wafer;

(E) oxidizing the resultant wafer from step (D) until a second oxide grows on the etched silicon substrate, and a lateral wall of the growing second oxide, frees itself from a region of the patterned nitride and first oxide layer to a predetermined outward distance;

(F) forming a second photoresist film at the portions with the exception of the surface of the nitride layer in a resultant structure from step (E) and making a planarization of the entire surface to the same height as the surface of the nitride layer;

(G) etching the nitride layer, the first oxide layer and a portion of a second oxide layer positioned at a vertical downward direction under the first oxide by an anisotropic etch method to expose a portion of the silicon substrate;

(H) stripping the second photoresist film;

(I) growing epitaxially the exposed portion of silicon substrate from step (G);

(J) depositing an insulating layer on the resultant structure from step (I); and (K) polishing the deposited insulating layer until the epitaxial layer is exposed.

This method for isolation between semiconductor devices according to the present invention can eliminate the generation of "bird's beak" compared with the conventional method of isolation between semiconductor devices. Accordingly, the present invention provides a feature capable of securing a sufficient active region of the semiconductor device.

These and other objects, features and advantages of the present invention will become more apparent in light of the detailed description of a best mode embodiment thereof, as illustrated in the accompanying drawing.

BEST MODE FOR CARRYING OUT THE INVENTION

The above other objects and features of the invention will more fully explained hereinafter in the following description taken in context with the accompanying drawings wherein an embodiment is illustrated by way of example.

FIG. 2(A) to (F) are cross-sectional views for explaining a method for isolation between the semiconductor devices in accordance with the one embodiment of this invention.

Figure 1:
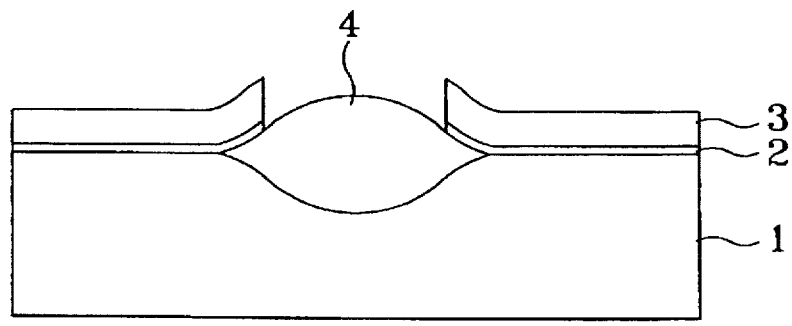
FIG. 1 is partial cross-sectional view of field oxide including surrounding active regions, which is formed by a conventional selective oxidation method of the local oxidation of silicon.
Figure 2A:
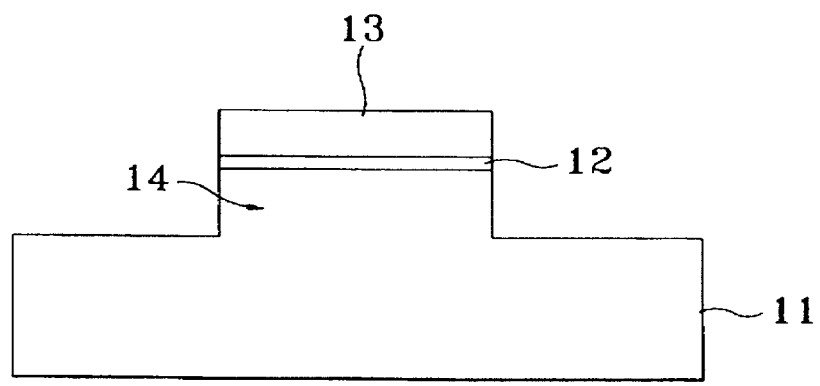
FIG. 2(A) to (F) are cross-sectional views for explaining a method for isolation between the semiconductor devices in accordance with the one embodiment of this invention.
Figure 3:
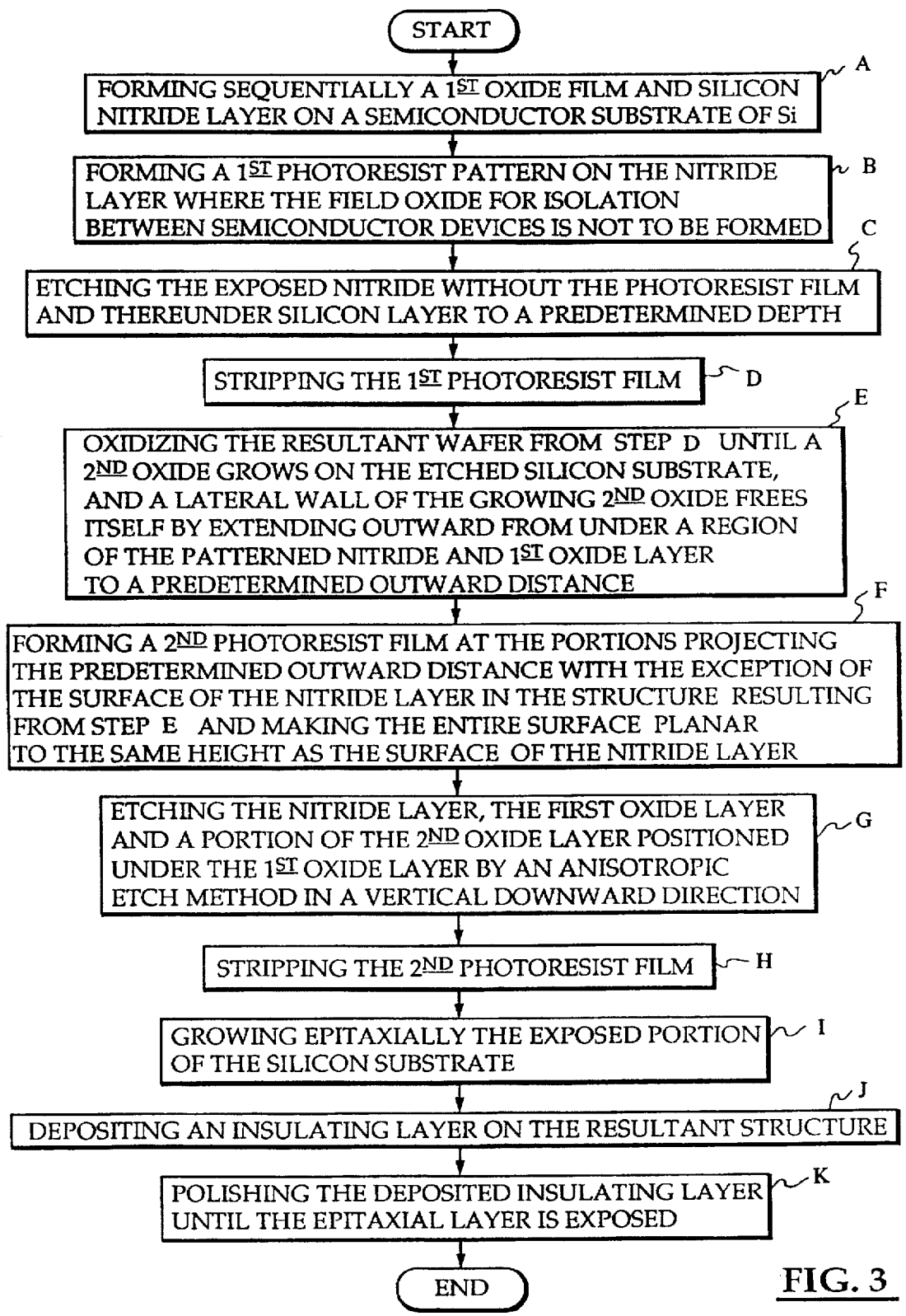
FIG. 3 is an illustration of a series of steps according to the present invention.

As shown in FIG. 2(A), in a first step (A) illustrated in FIG. 3, a first oxide film 12 of 100 to 300 Å thickness is formed on a semiconductor substrate 11 of silicon having a projection 14, after which a silicon nitride layer 13 of 1,000 to 2,000 Å thickness is formed on the first oxide layer 12. Thereafter, in a second step (B), a first photoresist film is formed on the silicon nitride layer 13, followed by a patterning process of exposure to light outside a pattern, dissolving the exposed photoresist, and performing an etch step. The first photoresist pattern is formed on the nitride layer 13 where a field oxide region for isolation between semiconductor devices is not to be formed. In a step (C) as shown in FIG. 3, the exposed nitride portions of where the photoresist pattern does not exist thereon are etched away and afterwards the underlying oxide layer and a silicon substrate layer are etched away up to a predetermined depth of the substrate 11, including the projection 14. Thus, projection portions are formed at the masking region. The thickness of a silicon substrate layer etched in the above step is about 0.5 to 1.2 μm range. In a step (D) shown in FIG. 3, the first photoresist pattern is stripped by a solution to form a resultant wafer.

Figure 2B:
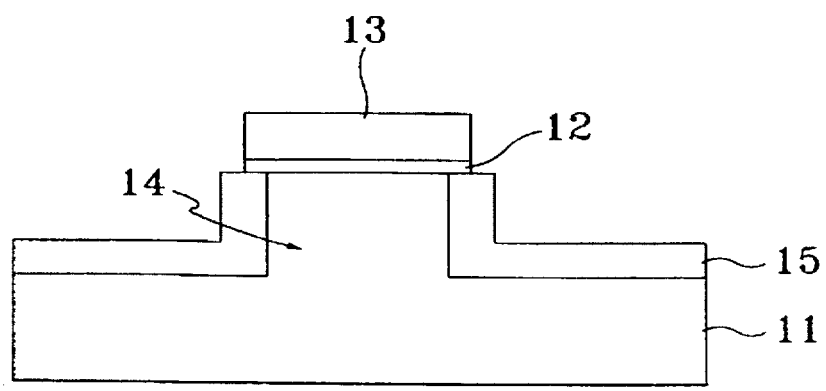

As shown in FIG. 2(B) and in a step (E) in FIG. 3, the resultant wafer from step (D) of FIG. 3 is thermally oxidized by a furnace annealing until a second oxide layer 15 grown from the lateral wall of the exposed silicon substrate by oxidation of the present step, frees or extends itself by growing laterally out from under the projection portions of the patterned nitride and first oxide layer 13 and 12 to predetermined outward distance. The thickness of the second oxide layer 15 grown, ranges from 3000 to 8000Å.

Figure 2C:
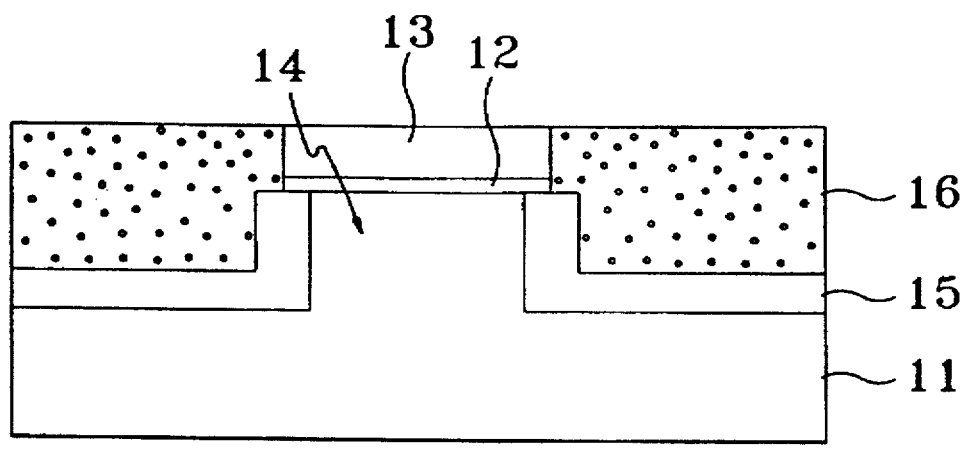

As shown in FIG. 2(C) and in a step (F) in FIG. 3, a second photoresist film 16 at the portions with the exception of the surface of the nitride layer 13 in the resultant structure of the thermal oxidation step (E) is filled and it is planarized at the same height as the surface of the nitride layer.

Figure 2D:
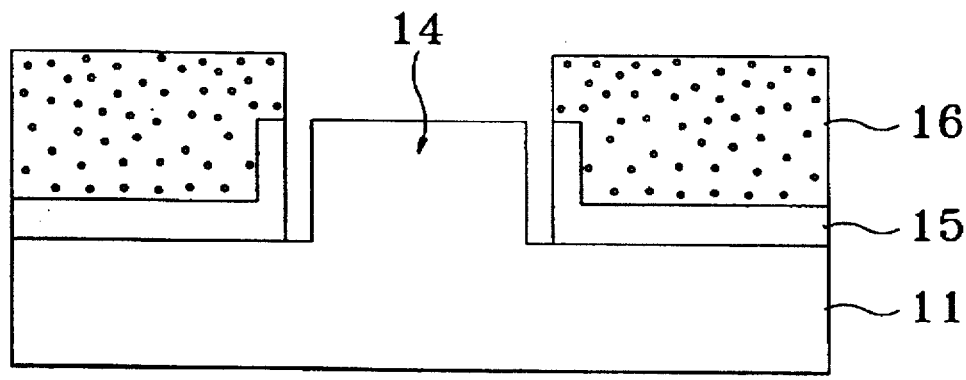

As shown in FIG. 2(D) and in a step (G) in FIG. 3, the nitride layer 13, the first oxide layer 12 and a portion of the second oxide layer that is positioned at the vertical downward direction under the first oxide 12, are etched away, e.g., by an anisotropic etch method.

Thereafter, as indicated in a step (H) in FIG. 3, the second photoresist film 16 is stripped by a solution according to the conventional method.

Figure 2E:
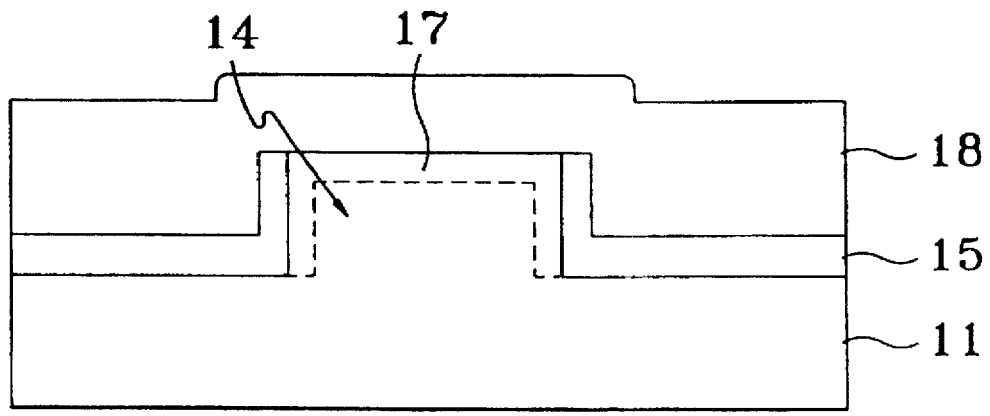

As shown in FIG. 2(E) and in a step (I) in FIG. 3, the exposed portion of silicon substrate in said step (G) is grown by epitaxial growth of single crystal and an epitaxial layer 17 is then formed thereon. The epitaxial layer 17 acts as an active region in a semiconductor device which is fabricated in a succeeding process.

Thereafter, as indicated in a step (J) in FIG. 3, an insulating layer 18 of 3000 to 10,000 Å thickness is formed on said epitaxial layer 17 and the second oxide layer 15. As an example of said insulating layer 18, TEOS (tetraethyl orthosilicate) is used. The insulating layer 18 has a difference in height due to the silicon etch step in the preceding process.

Figure 2F:
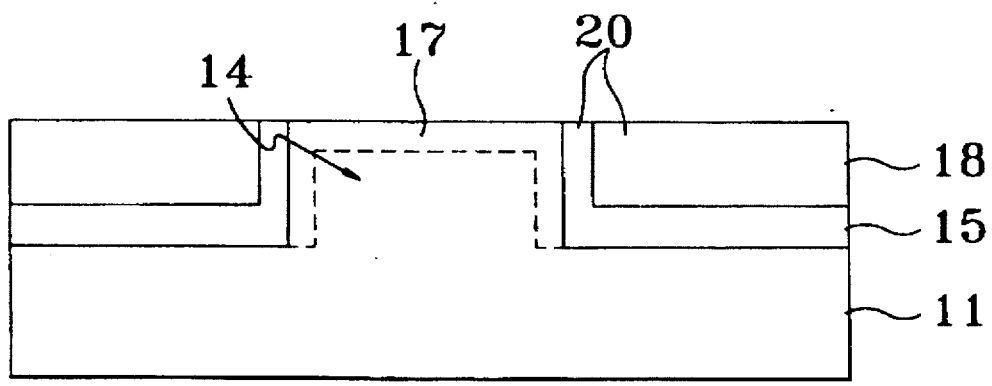

Subsequently, as shown in FIG. 2(F) and in a step (K) in FIG. 3, the insulating layer 18 is polished and is made planar by the conventional chemical mechanical process (CMP) until the epitaxial silicon layer 17 of single crystal is fully exposed. Consequently, a field oxide region 20 consisting of the insulating layer 18 and the second oxide layer 15 is formed.

It should be realized that although the use of a positive photoresist was described above in connection with the embodiment shown, that a negative photoresist could be used as well, merely by reversing the pattern. In other words, as will be understood by those skilled in the art, negative photoresists are employed in which the portion of the polymer that is not exposed to UV radiation is dissolved and the remaining part is fixed or cured so that it becomes resistant to the corrosive etches used next.

Similarly, features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming a field oxide for isolation between the semiconductor devices comprising the steps of:

(A) forming sequentially, a first oxide film and silicon nitride layer on a silicon substrate;

(B) forming a first photoresist pattern on the silicon nitride layer where the field oxide for isolation between the semiconductor devices is not to be formed;

(C) etching exposed silicon nitride without the first photoresist film and the underlying oxide layer and a silicon substrate layer up to a predetermined depth;

(D) stripping the first photoresist film to form a resultant wafer;

(E) oxidizing the resultant wafer from step (D) until a growing second oxide layer grows on the etched silicon substrate layer and a lateral wall of the growing second oxide layer grows laterally out from under a region of the patterned nitride and first oxide layer to a predetermined outward distance;

(F) forming a second photoresist film at the portions excepting the surface of the nitride layer in a structure resultant from step (E) and making a planarization of an entire surface of the second photoresist film to a same height as the surface of the silicon nitride layer;

(G) etching the silicon nitride layer, the first oxide film and a portion of the second oxide layer positioned at a vertical downward direction under the first oxide film to expose a portion of the silicon substrate;

(H) stripping the second photoresist film;

(I) growing epitaxially the exposed portion of the silicon substrate from step (G) to form a resultant structure;

(J) depositing an insulating layer on the resultant structure from step (I); and (K) polishing the deposited insulating layer until the epitaxial layer is exposed.

2. The method in accordance with claim 1, wherein the etch of the silicon substrate in step (C) is performed in the range of 0.5 to 1.2 μm.

3. The method in accordance with claim 1, wherein the etch of the silicon nitride, the underlying oxide layer and the silicon substrate layer in step (C) is performed by an anisotropic etch method.

4. The method in accordance with claim 1, wherein the step of etching of the silicon nitride layer, the first oxide film and the portion of the second oxide layer in step (G) is performed by an anisotropic etching method.

5. The method in accordance with claim 1, wherein a thickness of the second oxide layer ranges from 3,000 to 8,000 Å.

6. The method in accordance with claim 1, wherein a height of the second photoresist film in step (F) is equal to or lower than that of a height of the silicon nitride film.

7. The method in accordance with claim 1, wherein a grown epitaxial layer has a same height as the second oxide layer.

8. The method in accordance with claim 1, wherein a thickness of the insulating layer in step (J) ranges from 3,000 to 10,000 Å.

9. The method in accordance with claim 1, wherein the insulating layer in step (J) is tetraethyl orthosilicate.

* * * * *